United States Patent

Talbot et al.

[11] Patent Number: 5,401,972
[45] Date of Patent: Mar. 28, 1995

[54] LAYOUT OVERLAY FOR FIB OPERATIONS

[75] Inventors: Christopher G. Talbot, Menlo Park; Douglas Masnaghetti, San Jose, both of Calif.

[73] Assignee: Schlumberger Technologies, Inc., San Jose, Calif.

[21] Appl. No.: 115,997

[22] Filed: Sep. 2, 1993

[51] Int. Cl.6 .......................................... H01J 37/304
[52] U.S. Cl. .............................. 250/491.1; 250/492.3; 250/307; 356/400
[58] Field of Search ............... 250/491.1, 492.3, 492.2, 250/492.21, 492.1, 306, 307, 309; 356/400

[56] References Cited

U.S. PATENT DOCUMENTS

| | | | |
|---|---|---|---|
| 4,683,378 | 7/1987 | Shimase et al. | 250/491.1 |
| 4,795,260 | 1/1989 | Schuur et al. | 356/400 |
| 4,971,444 | 11/1990 | Kato | 250/491.1 |
| 5,004,927 | 4/1991 | Nakagawa | 250/309 |
| 5,054,097 | 10/1991 | Flinois et al. | 382/44 |
| 5,140,164 | 8/1992 | Talbot et al. | 250/309 |

FOREIGN PATENT DOCUMENTS

| | | | |
|---|---|---|---|
| 0282516 | 3/1990 | Japan | 250/491.1 |
| 3209813 | 9/1991 | Japan | 250/491.1 |

Primary Examiner—Jack I. Berman
Assistant Examiner—James Beyer
Attorney, Agent, or Firm—Kenneth Olsen; Keith G. W. Smith; Bruce D. Riter

[57] ABSTRACT

Focused ion bean (FIB) milling through a power plane of a device to expose or cut a hidden, lower-layer conductor requires accurate positioning relative to the hidden conductor of a box defining boundaries of the FIB operation. This can in general be done by aligning surface information (topology or voltage contrast) visible in a FIB or scanning electron microscope (SEM) image with an overlay image generated from stored data describing the device. The location of the hidden conductor relative to the visible surface information is determined from the stored data. Advanced integrated circuits often do not provide enough unique surface information near the FIB operation area to align the images with sufficient accuracy. In accordance with the invention, the imaging area is accurately deflected electronically (without moving the stage or changing the operating conditions of the FIB) to permit alignment over a much larger area, while maintaining pixel resolution and overlay accuracy needed to accurately position the FIB operation box.

21 Claims, 9 Drawing Sheets

LAYOUT OVERLAY FOR FIB OPERATIONS

BACKGROUND OF THE INVENTION

1. Field of the Invention

The present invention relates to charged-particle beam processing. In particular, the present invention relates to methods of determining the site of a selected feature of a sample.

2. The Prior Art

Focused ion beam (FIB) systems are used in a variety of ways to aid in diagnosis and repair of semiconductor integrated circuit (IC) devices. Such systems are used, for example, to mill away material overlying a conductor to expose the conductor, to sever the conductor, or to deposit conductive material to electrically interconnect conductors. When the conductor is hidden by overlying layers, it must be located so the FIB can be accurately positioned for milling.

Contrast images can be prepared by scanning an electron beam or ion beam over the surface of the device and detecting secondary charged particles. The detector signal is typically used to produce an image in which topological contrast or voltage contrast is visible. Only information about the surface of the device is visible. Nonetheless, a contrast image of the surface of the device will in some cases reveal the location of a conductor, such as when the edges of a conductor are visible as topological contrast in an overlying layer of insulation which conforms to the conductor's shape.

When the location to be milled is identified, the FIB is positioned and directed to begin milling. In a FIB system such as the IDS 7000 FIBstation TM system (available commercially from Schlumberger Technologies, Inc., of San Jose, Calif.), the contrast image is displayed and software tools allow an operator to draw a FIB operation box on the image. The FIB operation box defines the boundaries of a region to be milled or otherwise processed.

IC devices having three or four metal layers are increasingly common, and devices with five or more metal layers are expected in the future. Power planes can cover large areas of the IC, especially with advanced, highly integrated logic devices such as microprocessors. Underlying layers of such "planarized" devices are hidden, making buried conductors difficult to locate. In this situation, contrast images of the device offer little information useful in locating a specific buried conductor. Determining where to mill is difficult at best, as the operator cannot accurately position a FIB operation box relative to device features which are not visible in the displayed image. Using those features which are visible, and triangulating from them to locate an invisible feature, is tedious, inaccurate and error-prone.

The FIB column in a FIB system is positioned relative to the IC device by operating an X-Y stage. However, even precision mechanical stages cannot assure accurate enough positioning of the FIB relative to a typical device feature when translating the column from a fiducial mark or other known position. Current commercial systems having precision mechanical stages, even those with high-performance encoders such as interferometers, have residual beam-positioning errors of 0.5 $\mu$m in the best case and more typically 1 $\mu$m to 2 $\mu$m. This limitation is due to such factors as bearing accuracy and stage rigidity (Abbe error); column, stage and vacuum chamber rigidity; thermal expansion; bearing and lead-screw wear; alignment errors; and beam drift following die-level alignment. A simple FIB operation to cut or contact a 0.5 $\mu$m-wide, buried, invisible signal conductor requires that the FIB operation definition box be positioned with an accuracy of 0.1 $\mu$m or better, preferably 0.05 $\mu$m. A positioning error of 0.5 $\mu$m can easily cause a FIB milling operation to miss a buried conductor entirely.

Prior-art techniques are known for locating invisible conductors using computer-aided design (CAD) data. A mask layout overlay prepared from the CAD data is superposed on a contrast image of the device. The overlay is registered with the contrast image so that features of the device visible in the contrast image are aligned with corresponding features of the layout overlay. The location of a feature (such as a conductor) not visible in the contrast image relative to features visible in the contrast image is determined from the CAD data. FIB operation boxes can then be accurately positioned relative to the hidden feature. Such a technique can be carried out, e.g., with Schlumberger's IDS 7000 FIBstation TM system, as shown in the example of FIGS. 1A–1B.

FIG. 1A shows a contrast image display 100 of a portion of a device, in which conductors 102, 104, 106, 108 and 110 are visible as shaded areas. FIG. 1B shows a layout image display 150 in which conductors 160, 162, 164, 166 and 168 of a top metal layer, conductors 170, 172, 173, 174, 176 and 178 of an intermediate metal layer below the top metal layer, and conductor 180 of a bottom metal layer below the intermediate metal layer are shown in contrasting shading (preferably contrasting colors in the IDS 7000 FIBstation TM system). In the display of FIG. 1B, portions of the conductors of the intermediate metal layer are hidden where they pass beneath the conductors of the top metal layer. A graphic display of outlines of the conductors of FIG. 1B is prepared and superposed on the contrast image graphic display as shown in FIG. 1A. The outlines superposed on the display of FIG. 1A include the portions of the conductors which are hidden in the display of FIG. 1B. That is, lines 120, 122, 124, 126 and 128 correspond respectively to the outlines of top-metal conductors 160, 162, 164, 166 and 168; conductors 130, 132, 133, 134, 136 and 138 correspond respectively to the outlines of conductors 170, 172, 173, 174, 176 and 178; and lines 140 correspond to the outline of conductor 180.

When the superposed graphic display is aligned with visible conductors of the contrast image display as shown in FIG. 1A, the location of hidden conductors 172 and 178 is evident from layout lines 132 and 138. Examination of layout image display 150 shows that conductors 172 and 178 can be exposed by milling at regions defined by FIB operation boxes 190 and 192. FIB operation boxes 190 and 192 are marked on the image by the operator, along with a FIB operation box 194 which defines a region where FIB deposition of metal is to be performed to interconnect conductors 172 and 178. Overlay techniques are also described, for example, in U.S. Pat. No. 4,683,378 to Shimase et al.

Overlay techniques can work well if the contrast image contains enough unique topographic information to accurately register the mask layout overlay using device features visible in a localized field of view. However, as power planes get larger, contrast images contain less surface topography useful for overlay positioning. Surface topography of an advanced IC in the vicinity of an intended FIB operation is often insufficient to register the overlay with the required accuracy.

For example, the minimum contrast-image pixel size which will allow positioning of a FIB operation box with 0.1 μm resolution is 0.1 μm. In this context, the term "pixel" means a discrete element of the acquired data set describing a contrast image, which may or may not correspond to a discrete element of a display screen on which the contrast image is displayed. The "pixel size" refers to spacing of discrete elements of the acquired data set relative to dimensions of the device being imaged. A minimum pixel size of 0.01 μm is preferable, allowing a FIB operation box to be positioned within 10 pixels and assuring a worst-case alignment error of $\leq 0.1$ μm.

FIGS. 2A and 2B show an example of how registration accuracy is limited by the pixel resolution and the field of view (FOV) of the contrast image. FIG. 2A shows an image portion 200 comprising a 5 μm×5 μm FOV with a pixel size of 0.01 μm. Image portion 200 includes a 0.5 μm-wide conductor 205 on which a FIB operation box 210 is to be placed. In the expanded view of FIG. 2B, conductor 205 is seen to be 50 pixels wide, so a maximum acceptable positioning error of 0.1 μm is equivalent to 10 pixels.

A contrast image of up to 1000×1000 pixels is typical for today's commercial FIB systems. Greater resolution is not particularly desirable because of the long time needed to acquire an updated image and the limited availability of higher-resolution displays. For example, a single image having a 1 mm×1 mm field of view (FOV) with 0.01 μm pixel resolution requires 10 Gigabytes of storage for 256 gray levels per pixel. That is 10,000 times the data in a single 1000×1000 pixel image of comparable resolution and would take 10,000 times as long to acquire. Acquiring a high-resolution, 1000×1000 pixel image at low beam current (5 pA to 50 pA for high spatial resolution) takes from 10 seconds to 60+ seconds, so acquiring a single 10 Gigabyte image would take hours or even days!

For an image size limited to 1000 times the pixel resolution and a pixel size of 0.01 μm to 0.1 μm, the FOV of the image ranges from 10 μm×10 μm to 100 μm×100 μm. If the nearest surface topography visible in the image is several hundreds of microns away from an area where a FIB operation box is to be placed, alignment accuracy of 0.1 μm cannot be achieved—the FOV would have to be zoomed to a pixel resolution larger than the required positioning accuracy in order to view the surface topography and the operation box placement area.

Similar to the problem of hidden conductors is the aliasing problem which exists with regular repeating structures of devices such as random-access memories (DRAMs and SRAMs), where accurate identification of an individual cell can only be achieved by counting from the edge of an array. For example, FIG. 3A shows a DRAM chip 300 having blocks of regular, repetitive RAM cells. FIG. 3B shows a simplified, expanded view of a portion 320 of chip 300 within area 310 having repetitive cells 330-346. If the stage of a FIB system is moved in the X-direction to center the FIB column on a selected cell 342, that cell cannot be uniquely identified if the stage error a is greater than or equal to one-half the repetition period p of the DRAM cells. Thus, for a 1 μm-square DRAM cell, a stage accuracy of better than 0.5 μm (preferably better than 0.25 μm) is needed to position the FIB column at that cell. With ever-shrinking device geometries, improved techniques are needed to accurately locate selected device features.

SUMMARY OF THE INVENTION

The present invention offers methods and apparatus for determining the site of a selected feature of a specimen such as an IC. Registration of an overlay image with a contrast image of the specimen over an area larger than the field of view of the contrast image is possible, while maintaining the pixel resolution and overlay accuracy needed to accurately position a FIB operation box or other marker relative to selected feature of the device. The methods and apparatus are particularly suitable for FIB modification and repair of IC devices. In accordance with preferred embodiments, the imaging area is accurately deflected electronically without moving the stage or changing the operating conditions of the FIB.

A preferred method in accordance with the invention comprises:

a. fixing a beam source relative to a surface of a specimen so that a beam from the source can be directed at the surface over a region which includes an expected site of a selected feature of the specimen;
 b. scanning the beam over a first alignment area of the surface to acquire a first contrast image in which a first feature is visible and which excludes the expected site of the selected feature;
 c. displaying the first contrast image;
 d. generating from stored data describing features of the specimen a first overlay image which includes a representation of the first feature;
 e. displaying the first overlay image;
 f. registering the first overlay image with the first contrast image using as a first alignment point the representation of the first feature in the first overlay image and the first feature visible in the first contrast image; and
 g. determining the site of the selected feature from the stored data using the first alignment point as a reference.

These and other aspects of the invention will become apparent to those of skill in the art from the following description and the accompanying drawing figures.

DESCRIPTION OF PREFERRED EMBODIMENTS

Methods of the present invention can be carried out with a FIB system modified as described below with reference to FIG. 6. A description of such a system without the modifications described below is found, for example, in U.S. Pat. No. 5,140,164 to Talbot et al., the content of which is incorporated herein by this reference.

Figure 4:
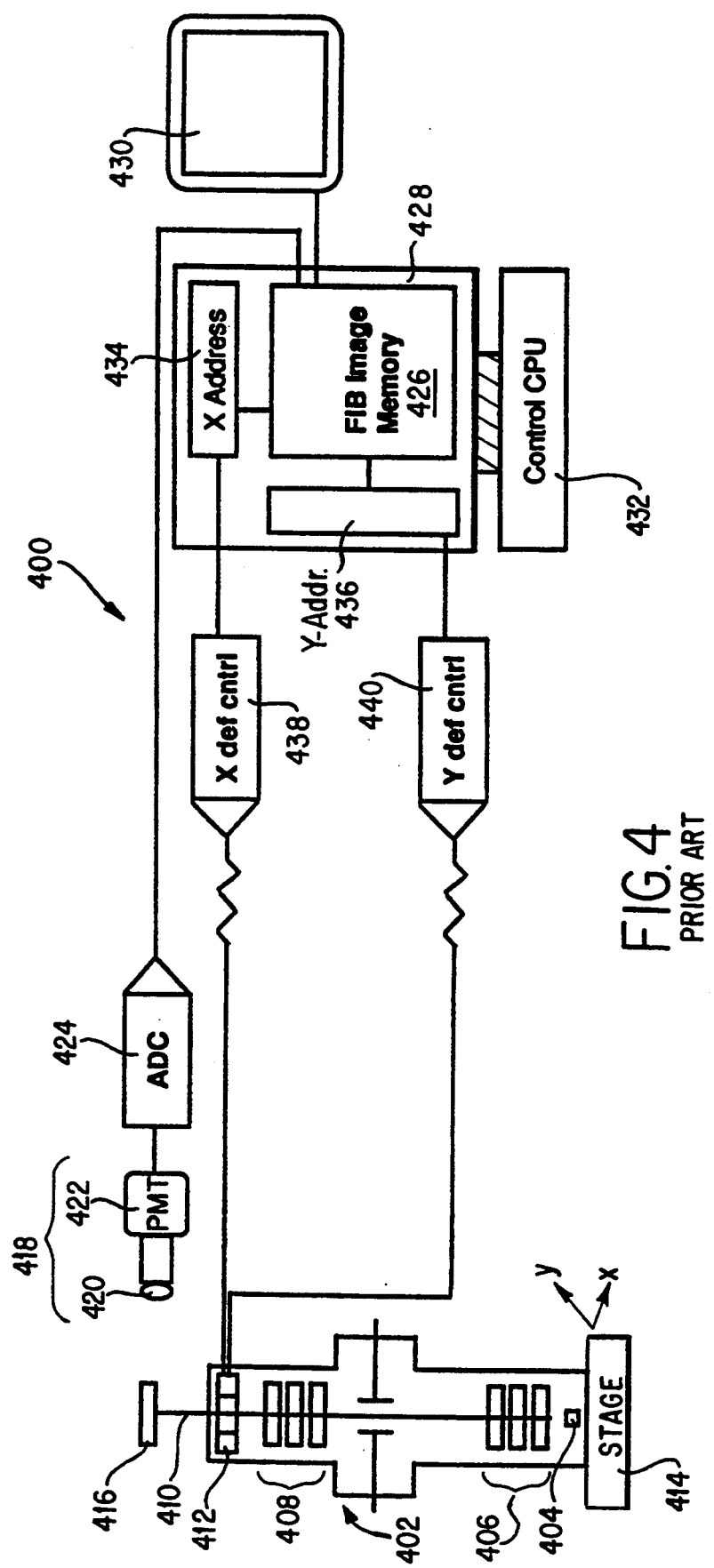
FIG. 4 is a simplified schematic of a prior-art FIB system.

FIG. 4 is a schematic view of major components of a conventional FIB system 400 such as a Schlumberger IDS 7000 FIBstation TM system. The system includes a FIB column 402 having a liquid-metal ion source (LMIS) 404 and ion-optical lenses 406 and 408 for generating a FIB 410, an octupole element 412 responsive to control signals for controlling deflection of the FIB, and a controllable stage 414 for positioning FIB column 402 relative to an IC 416 or other sample. A detector 418 with scintillator 420 and photomultiplier 422 is provided for detecting secondary particles to produce a corresponding detector signal which is digitized in an analog-to-digital converter (ADC) 424. The digitized detector signal is sampled to produce a set of data defining a contrast image. The data can be stored in image memory 426 of memory 428 and/or displayed on display device 430. System operation is controlled by a control CPU 432. X and Y pixel-address information, illustrated schematically as stored in an X-address memory portion 434 and a Y-address memory portion 436 of memory 428, are supplied respectively to an X-deflection-control digital-to-analog converter (DAC) 438 and Y-deflection control DAC 440. DACs 438 and 440 in turn supply analog control signals to octupole 412 for controlling deflection of FIB 410.

To acquire a contrast image, FIB column 402 is positioned relative to IC 416 such that FIB 410 can be scanned over a region of interest. As octupole 412 is controlled to scan FIB 410 over the region, the digitized detector signal is sampled. Resolution of the acquired image is determined by the number of detector-signal samples taken per unit of FIB deflection over the surface of the IC. The magnification, and FOV, of the image are determined by the limits of FIB deflection over which detector-signal samples are taken.

Figure 5:
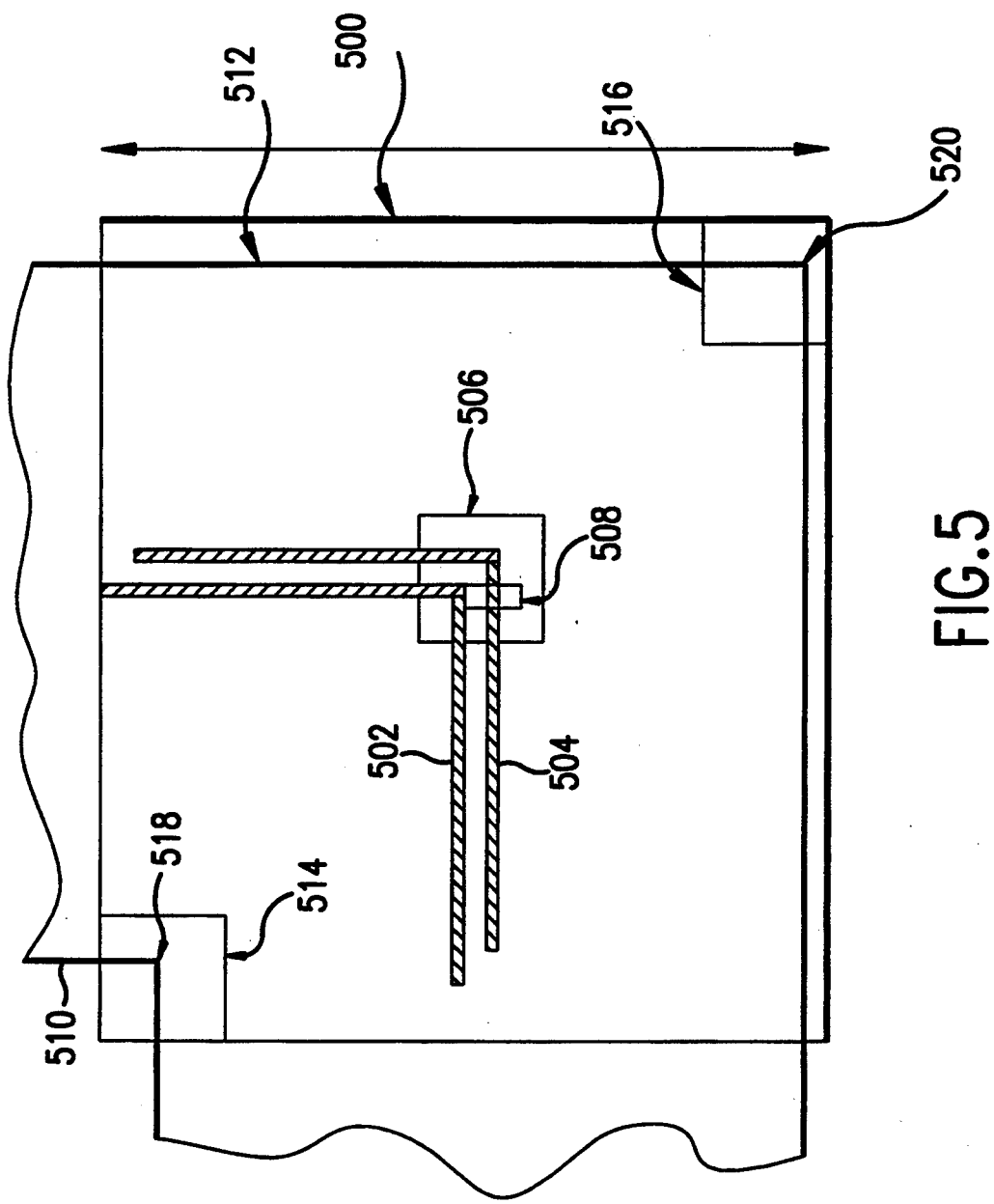
FIG. 5 illustrates a method of large-area layout overlay registration in accordance with the invention.

FIG. 5 illustrates an example (not drawn to scale) of carrying out a FIB operation in accordance with the invention. At 500 is outlined a region of an IC's surface of 0.5 mm×0.5 mm or more. Near the center of region 500 is a pair of buried conductors 502 and 504 which are not visible in a contrast image of region 506. It is desired to precisely place a FIB operation box 508 defining the boundaries of an area to be milled to expose or sever conductor 504. Since conductors 502 and 504 are not visible, a CAD layout overlay will have to be used so that FIB operation box 508 can be correctly placed. However, a contrast image of region 506 offers no visible features to use for registration of the layout overlay to the contrast image.

Also passing through region 500 are top-metal conductors, such as power buses 510 and 512, which are visible in contrast images of regions 514 and 516, respectively. In region 514 is a feature useful as an alignment point, such as corner 518. In region 516 is a feature useful as an alignment point, such as corner 520. If the FOV were expanded to include regions 506, 514 and 516, then acquiring an image with the resolution needed for accurate registration would take too much time and memory, or the resolution would be too low to assure precise enough image registration. Operating stage 414 to move the FIB column between alignment points is not acceptable because of limited stage precision.

In accordance with preferred embodiments of the invention, the FOV is accurately offset by electronically shifting the FIB's imaging area, without operating stage 414 to move FIB column 402 and without changing the operating conditions of the FIB. This enables the registration of a mask layout overlay with a contrast image over an area much larger than the FOV of an individual contrast image, while maintaining the pixel resolution and overlay accuracy needed to position a FIB operation box with the required precision.

Exemplary Procedure

Figures 1A, 1B:
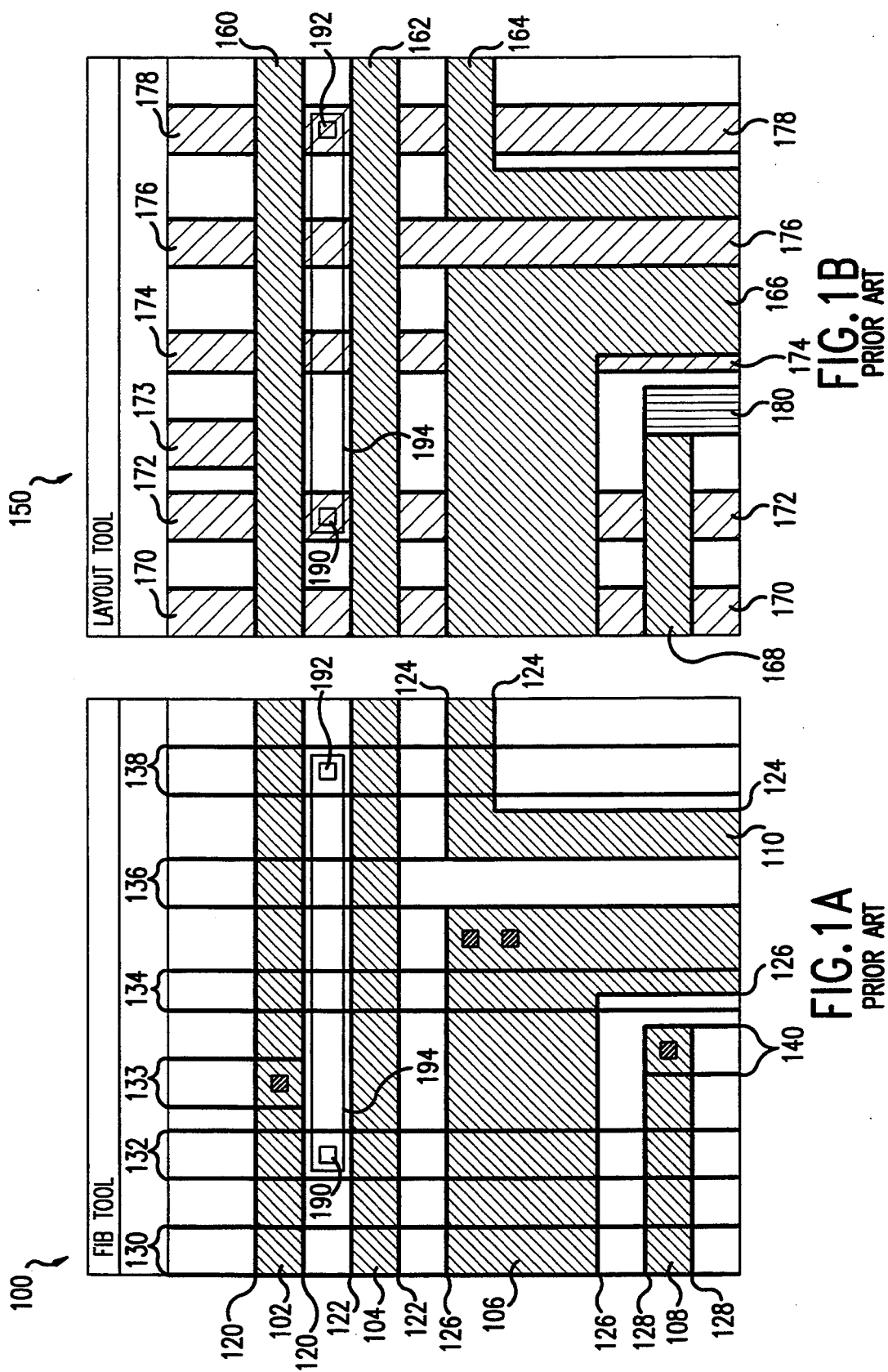
FIGS. 1A and 1B illustrate a prior-art CAD layout overlay method of beam positioning.
Figure 2B:
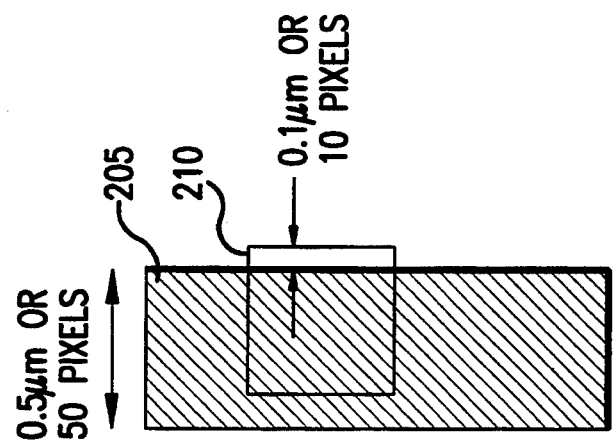
FIGS. 2A and 2B illustrates a limitation of prior-art CAD layout overlay methods.
Figure 2A:
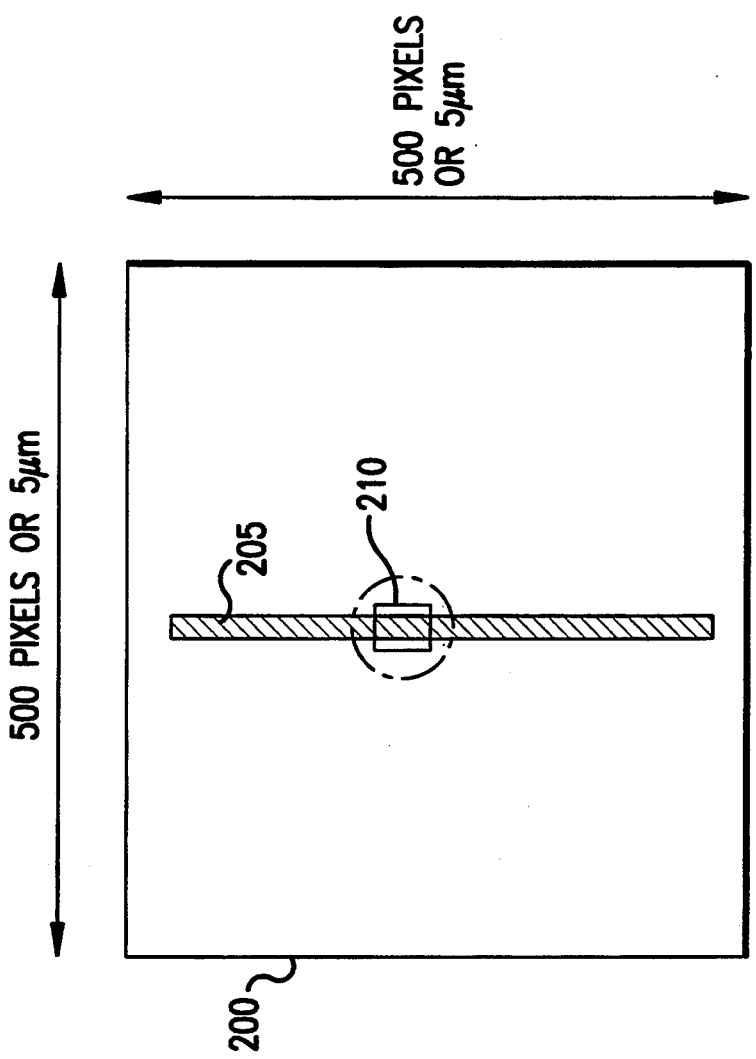
Figure 3A:
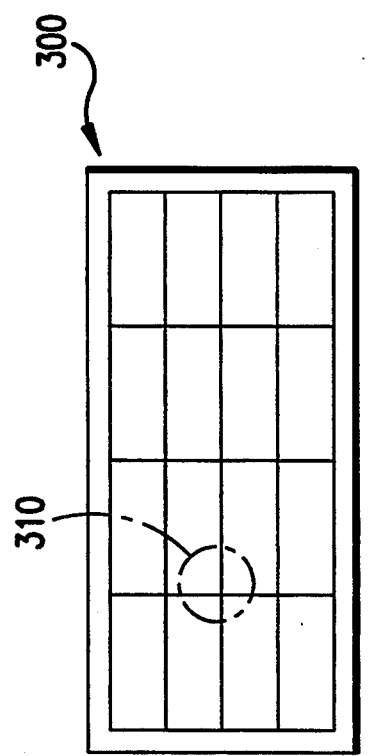
FIGS. 3A and 3B illustrates a prior-art stage-accuracy aliasing problem in devices having repetitive structures.
Figure 3B:
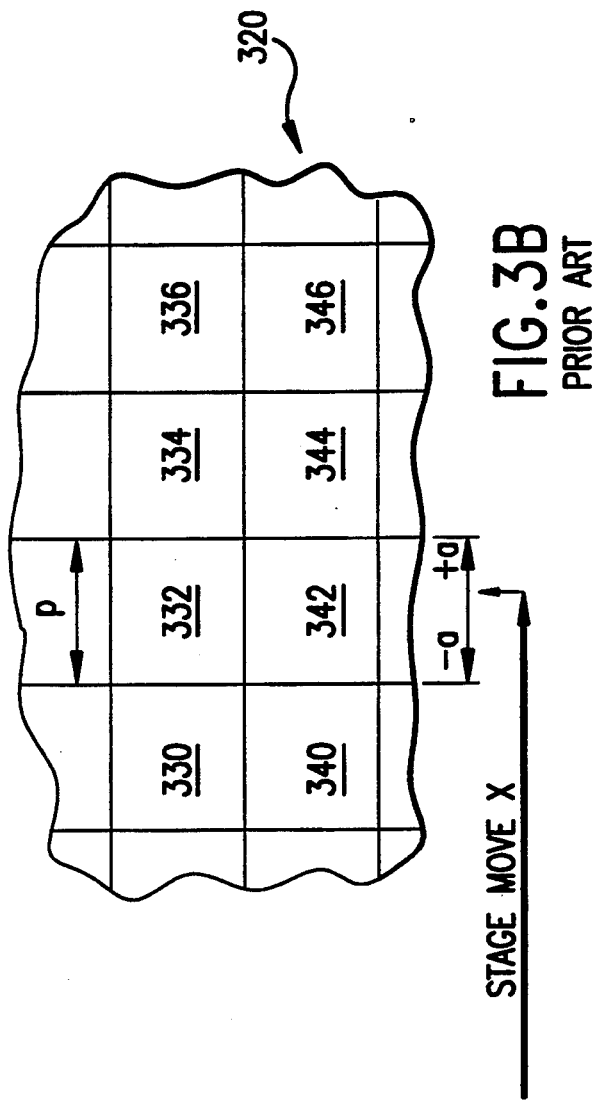

With the following exemplary procedure, the site of a selected feature of a specimen (such as a buried conductor of an IC device or a specified cell of a repetitive RAM structure) can be determined even when no useful alignment information is available within a FOV which includes an expected site of the selected feature:

a. Fix a beam source relative to a surface of a specimen so that a beam from the source can be directed at the surface over a region which includes an expected site of a selected feature of the specimen. The expected site of the selected feature is determined, for example, by reference to a displayed image (such as a layout image) of the sample on which a representation of the selected feature is visible. A FIB operation box 508 or other mark can be positioned relative to the representation of the selected feature on the layout image. Column 402 is preferably positioned so that FIB 410 is approximately centered over the expected site of the selected feature with zero DC offset of the FIB, thus assuring that the final FIB operation is performed on or near the optical axis of the FIB column to minimize the effects of off-axis, optical-lens aberrations. FIB 410 will thus be roughly aligned with the optical axis of column 402 when scanned over the region 506 where FIB operation box 508 is to be placed. This rough positioning can be accomplished by operating stage 414 and counting X-Y displacement from a known location such as a corner of the sample. The X-Y displacement is determined from the layout image or other stored data describing features of the specimen. Once positioned, mechanical stage 414 is frozen to eliminate the uncertainty of stage inaccuracy from the operation.

b. Scan the beam over a first alignment area (514) of the surface to acquire a first contrast image in which a first feature (518) is visible and which excludes the expected site of the selected feature. To identify alignment areas, the FIB-image FOV is preferably zoomed out to obtain a low magnification, low resolution image which includes one or more areas having visible surface features useful for overlay alignment. For example, the FIB magnification is reduced to obtain an image covering registration area 500 at a resolution too low to achieve accurate overlay registration but sufficiently high to visually locate conductors 510 and 512. A layout image display can be consulted as a reference for selecting alignment points. Selected alignment areas are preferably situated as close to the FIB operation area as possible and as far apart from each other as possible. For example, regions 514 and 520 at opposite corners of region 500 are identified as having visible topography suitable for use as alignment points. After selecting alignment areas, the FOV of the FIB image is zoomed in to obtain a high magnification, high resolution image, the FIB scan area is shifted to the first alignment area, and a contrast image of the first alignment area is acquired. For example, the magnification is reduced to cover an image area the size of region 514 and the FIB scan area is shifted from region 506 to region 514 to acquire a contrast image of region 514.

c. Display the first contrast image (e.g., of area 514).

d. Generate from stored data describing features of the specimen a first overlay image which includes a representation of the first feature. The stored data can be CAD layout data from which a layout image of the type shown in FIG. 1B or of the type shown overlaid in FIG. 1A is generated. The stored data can be any type of data describing features of the specimen, such as data defining a SEM topological contrast image or a SEM voltage contrast image, or an optical image.

e. Display the first overlay image (e.g., a CAD layout image). The overlay image can be displayed superposed on the contrast image (as in FIG. 1A), or adjacent to the contrast image (as in FIG. 1B), or the overlay image and the contrast image can be displayed in succession.

f. Register the first overlay image with the first contrast image using as a first alignment point the representation of the first feature in the first overlay image and the first feature visible in the first contrast image. Typically, a feature to be used as an alignment point is selected in the contrast image of the alignment area, the corresponding feature is selected in the overlay image, and data identifying the alignment point in the coordinates of each of the images is stored. For example, point 518 is selected in a contrast image of region 514 and in a CAD layout image of region 514, and identifying data is stored. The identifying data may comprise, for example, X-Y coordinates of the registered alignment point for each of the contrast image and the CAD layout image, or instead a vector describing relative alignment of the images or other suitable registration data is stored. The images may be displayed registered to one another, such as when displayed overlaid one on the other as in FIG. 1A, but need not be displayed in this manner so long as the position of the alignment point is known for each of the two images.

g. Determine the site of the selected feature from the stored data using the first alignment point as a reference. Coordinates of the alignment point and of the selected feature in the overlay coordinate system are known from the stored data describing the specimen. The position of the alignment point in the coordinate system of the contrast image (e.g., in the coordinate system used to deflect the FIB to acquire the contrast image) is known. The site of the selected feature can thus be readily determined from the stored data using the alignment point as a reference. For example, once the position of alignment point 518 is known in the coordinates of a contrast image of region 514 and in the coordinates of a CAD layout description of the IC, then the site of a feature such as conductor 504 where FIB operation box 508 is to be placed can be determined from the CAD layout description of the IC.

A single alignment area (single-point alignment) is sufficient if the sample surface is orthogonal to the optical axis of FIB column 402 and if accurate rotational alignment of the contrast image with the layout image has already been achieved and if image magnification is accurately calibrated. Two alignment areas (two-point alignment) suffice if the sample surface is orthogonal to the optical axis of FIB column 402. Three alignment areas (three-point alignment) will allow correction for a sample surface tilted relative to the optical axis of column 402. Techniques for pixel-to-pixel alignment of images using selected alignment points are known in the art. See, for example, U.S. Pat. No. 5,054,097 of Flinois et al., the content of which is incorporated herein by this reference. Magnification can be calibrated using a standard of known dimension or, for multi-point alignment, using the layout image as a reference. Multi-point alignment can also be used to verify and correct for general sources of error such as unwanted beam deflection caused by static-electric and/or magnetic fields of the sample.

If a second alignment point is needed, then the beam is scanned over a second alignment area to acquire a second contrast image in which a second feature is visible and which excludes the expected site of the selected feature. For example, the FIB scan area is shifted from region 514 to region 516 and a contrast image of region 516 is acquired. The second contrast image is displayed. A second overlay image is generated which includes a representation of the second feature, and the second overlay image is displayed. The second overlay image is registered with the second contrast image using as a second alignment point the representation of the second feature in the second overlay image and the second feature visible in the second contrast image. For example, point 520 in region 516 is aligned with the corresponding point on a CAD layout display. The procedure can be repeated for a third alignment point if needed. The site of the selected feature is determined from the stored data using the first and second (or first, second and third) alignment points as references.

Once the site of the selected feature is determined, the FIB scan area can be shifted to a position approximately centered on the FIB operation area to commence FIB operations. A contrast image of the FIB operation area can optionally be acquired, though the FIB can simply be shifted to begin FIB operations without acquiring or displaying an image of the area. For example, the FIB scan area is shifted to cover the FOV of region 506, roughly centered over the location where FIB operation box 508 is to be placed over buried conductor 504. An overlay image of the FIB operation area can be superposed on the contrast image of the area and registered with the contrast image of the area (as in FIG. 1A) using the stored alignment point data. A FIB operation box marked on the overlay image is thus correctly positioned on the contrast image of the FIB operation area. For example, an overlay showing conductors 502 and 504 is registered to a contrast image of region 506 using the stored data for alignment points 518 and 520. FIB operation box 508 is thus accurately positioned over conductor 504 in a display of region 506.

Those of skill in the art will recognize that the operating conditions of the FIB column should not be changed in a manner that may offset the beam significantly. This will usually mean not changing the beam current. If necessary, the FIB operation (e.g., the FIB milling operation) can be started at the imaging current to mark the FIB operation area on the surface of the IC. When the surface is sufficiently marked to be visible in a contrast image acquired at the higher FIB current preferred for milling, the FIB current is increased. If the increase in FIB current causes a beam offset, the contrast image will appear to shift relative to the FIB operation box. The FIB operation box can then be registered with the visible milled area to correct for image shift due to FIB current change.

FIB System Modifications

With a FIB system modified in accordance with the invention, it is possible to accurately shift the imaging area in order to do an alignment over a much larger area than the typical 1000×1000 pixel image, while maintaining pixel resolution and overall accuracy sufficient to position FIB operation boxes to within less than 0.1 μm.

Figure 6:
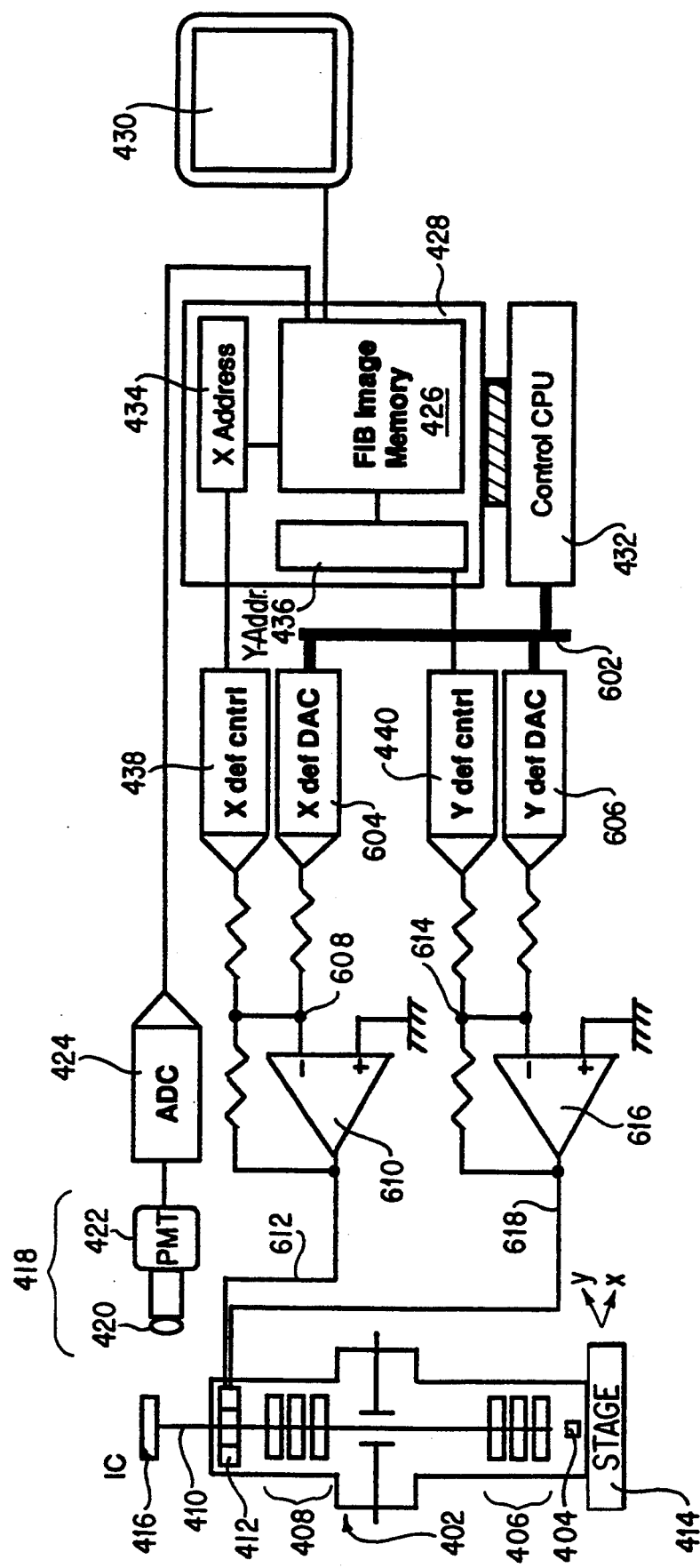
FIG. 6 is a simplified schematic of a FIB system having beam-deflection control circuitry in accordance with the invention.

For example, FIG. 6 is a schematic diagram of the FIB system of FIG. 4, modified in accordance with the invention. In FIGS. 4 and 6, like components are identified with like reference numerals. Control CPU supplies digital shift-control signals via a bus 602 to an X-deflection DAC 604 and a Y-deflection DAC 606. DAC 604 supplies an analog X-offset signal to a summing junction 608 where the X-offset signal is summed with the X-deflection scan waveform from DAC 438. The summed X-axis signal is supplied via a buffer 610 to the X-axis control input line 612 of octupole element 412. DAC 606 supplies an analog Y-offset signal to a summing junction 614 where the Y-offset signal is summed with the Y-deflection scan waveform from DAC 440. The summed Y-axis signal is supplied via a buffer 616 to X-axis control input line 618 of octupole element 412.

By supplying the appropriate X-offset and Y-offset signals from control CPU 432, the FIB scan area can be shifted from one region to another without operating mechanical stage 414 or changing the operating parameters of FIB 410. The result is an accurate, electronic shifting of the FIB scan area which can be introduced or changed at will within the scan limits of the FIB. For example, the FIB scan area in FIG. 5 can be readily shifted between regions 506, 514 and 516 by simply changing the X-offset and Y-offset values supplied from control CPU 432 to DAC 604 and DAC 606. Assuming for example that it is desired to select alignment points with an overall accuracy of 1 μm and that an image resolution (pixel size) of 0.02 μm is used to allow 5 pixels per 0.1 μm, then the required linear resolution for a region 500 as large as 1 mm×1 mm is 1000 μm/0.02 μm =50,000<$2^{16}$. DAC 604 and DAC 606 can thus be currently-available, sixteen-bit devices with linearity error less than 1 bit. For commercial systems today, a beam deflection of 0.25 mm in each of the X- and Y-directions is more typical, giving a 0.5 mm×0.5 mm FOV. In general, a resolution of about 1/5 to 1/10 the desired accuracy is preferred.

Those skilled in the art will recognize that the hardware modification of FIG. 6 is only one way of implementing an offset of the FIB scan area. Other hardware modifications to the system of FIG. 4 could be made to achieve the result, such as implementing DACs 438 and 440 with high-resolution circuits capable of handling the necessary X- and Y- deflection ranges. Since the scan-deflection addresses stored in X-address memory 434 and Y-address memory 436 are established under control of CPU 432, they can be incremented or decremented at will in the amount of the offset to be applied.

Sources of Error for Large Beam Deflection

Figure 7:
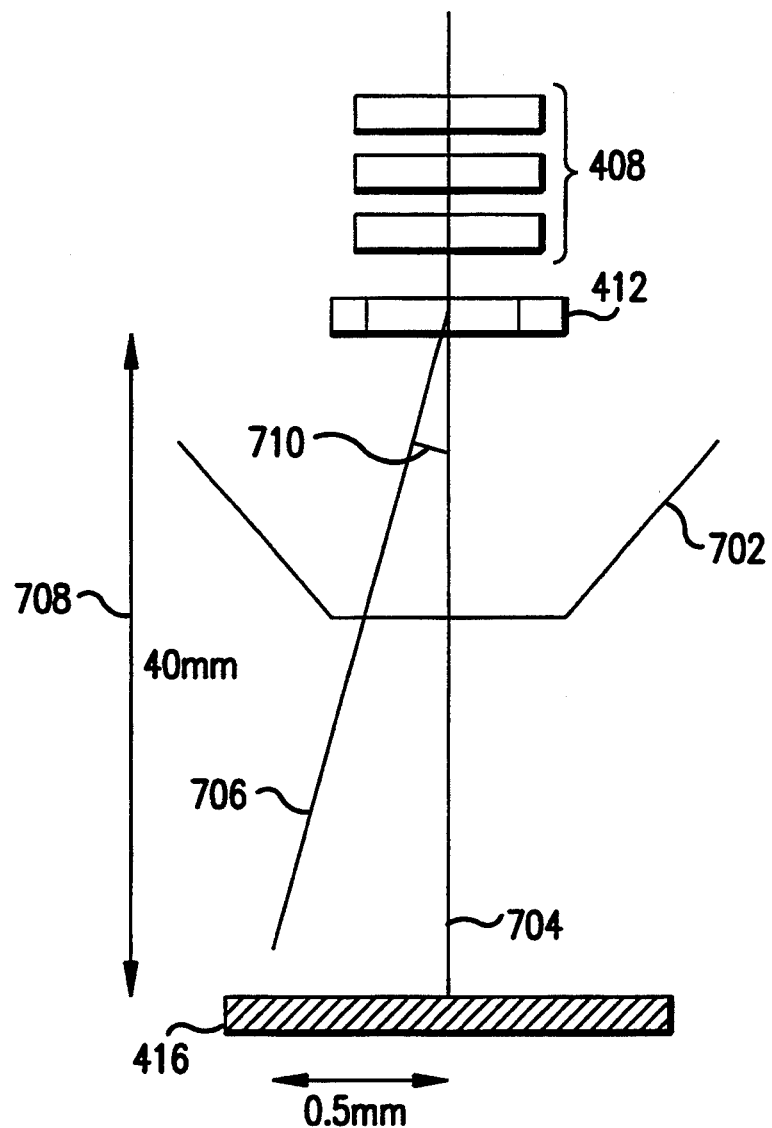
FIG. 7 illustrations potential sources of error for large deflection of a FIB.

FIG. 7 illustrates potential sources of error for large deflection of FIB 410 such as would occur when shifting the scan area from region 506 to region 514 or region 516. The beam passes through objective focus lens 408, is deflected by octupole element 412, and exits FIB column 402 through a column nose-cone 702 before impinging on sample IC 416. For illustration purposes, the FIB is shown undeflected at 704 and deflected at 706. If the distance 708 from octupole 412 to IC 416 is 40 mm and the deflection angle 710 is 0.0125 radians, beam deflection over the surface of IC 416 covers a scan area of 1.0 mm diameter. Under these assumptions, the change of working distance from octupole 412 to IC 416 as the beam is deflected is <3 μm. Compared with a typical depth of focus on the order of 100 μm, the change of working distance has no significant beam defocusing effect. Geometric error in this example is thus expected to be less than 0.04 μm (<0.01%) and to be correctable. The actual error encountered in a given system will depend on system design factors.

Adaptation of Image Aspect Ratio

Figure 8B:
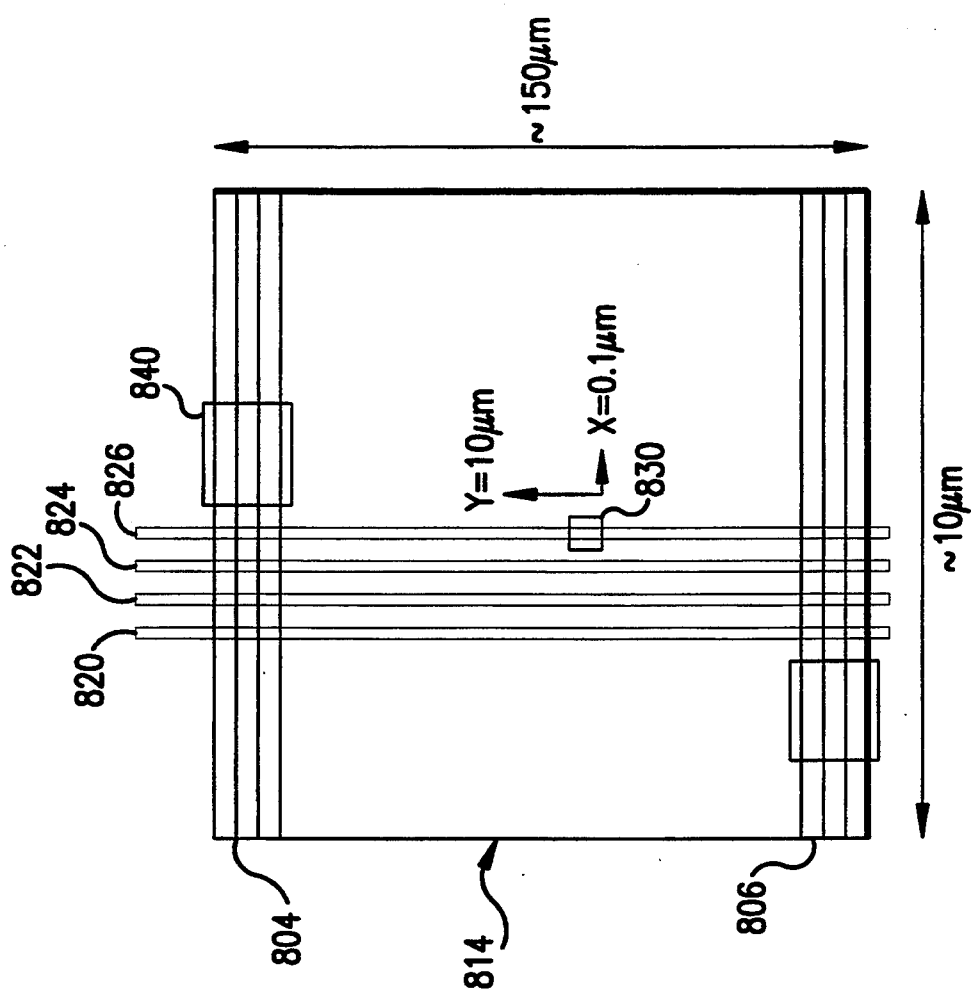
FIGS. 8A and 8B illustrate adaptation of image aspect ratio to visible topography in accordance with the invention.
Figure 8A:
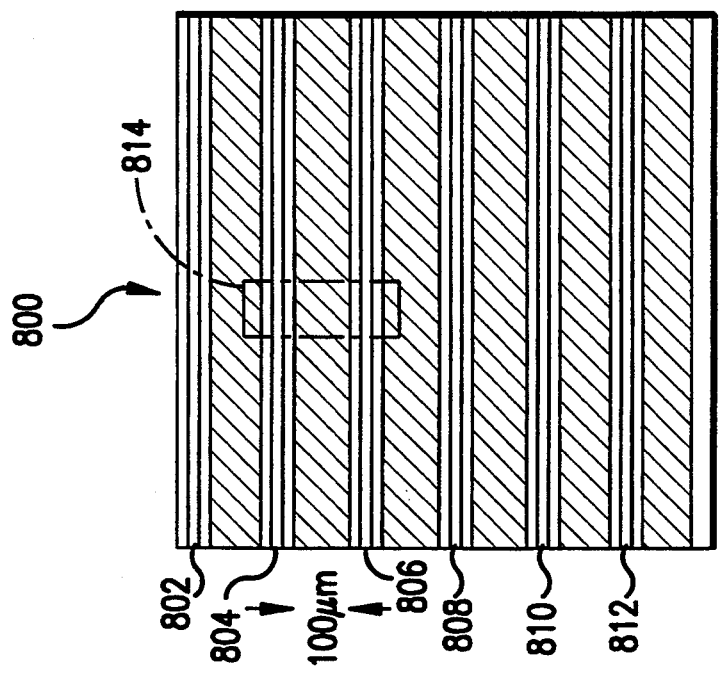

It will be recalled that resolution of an acquired image is determined by the number of detector-signal samples taken per unit of beam deflection. Image magnification is determined by the range of beam deflection over which samples are taken. The aspect ratio of an image can be selected by independently setting the X-axis and Y-axis scanning limits and sampling frequencies. FIGS. 8A and 8B illustrate an example of adapting the image aspect ratio to the topology of an IC. Adapting alignment area aspect ratio to visible topography allows for increased alignment precision in one axis and corresponding increased positioning accuracy in that axis. The time and data storage needed to acquire the contrast image are reduced without sacrificing image registration accuracy.

FIG. 8A shows a portion of an IC 800 having a series of 100 μm-wide parallel power buses 802, 804, 806, 808, 810 and 812. A box outlines a rectangular region 814 of IC 800 over which a layout image is to be aligned with a contrast image. FIG. 8B shows an enlargement of region 814 having an aspect ratio of about 15:1, i.e., covering a Y-axis dimension 820 of ~150 μm and an X-axis dimension 822 of ~10 μm. Passing through region 814 in the X-direction are portions of top-metal-layer power buses 804 and 806. Also passing through region 814 in the Y-direction are 0.5 μm-wide conductors 820, 822, 824 and 826 of a buried-metal layer which are spaced apart 0.5 μm from one another. For purposes of the example, it is desired to place a FIB operation box 830 to expose or sever conductor 826 by FIB milling.

Because of the wide spacing between power buses 804 and 806, an error in placing FIB operation box 830 of 10 μm in the Y-direction is acceptable, while the close spacing of narrow, hidden conductors 824 and 826 dictates a maximum acceptable placement error of 0.1 μm in the X-direction. In this example, each 1% of placement error in the Y-direction over region 814 corresponds to 1.5 μm, while each 1% of placement error in the X-direction over region 814 corresponds to only 0.1 μm. Since conductors 820–826 are not visible in a contrast image, the FIB scan area can be offset to alignment regions 840 and 842 in which power buses 804 and 806 are visible and can be used for registration of a layout overlay image. The FIB scan area can then be shifted so that it is approximately centered on a location where FIB operation box 830 is to be placed to produce a contrast image having no visible topological information. Using registered layout overlay image, FIB operation box 830 can nonetheless be placed on conductor 826 with a maximum error of 0.1 μm along the X-axis. Aligning images in accordance with the present invention can enable FIB operations to be accurately positioned relative to buried features even in regions where there is no topological information at all for use in image registration.

Changing the aspect ratio of the image can also be used to advantage to correct for beam drift over time, an implementation concern with a very large FOV. Changing the aspect ratio can bring into the image more topological information (which may not be plentiful enough in the vicinity of the FIB operation box) for use in recognizing that unwanted shift between previously-registered contrast and layout images is being introduced by beam drift.

IC Layer-to-Layer Registration Error Correction

The registration of layers during fabrication of an IC is performed with steppers which are not perfectly accurate. The more layers an IC has, the more errors are "stacked up" as the device is manufactured. Unavoidable offsets between layers of an IC thus create a discrepancy between the CAD layout overlay and the actual IC device which can be significant, for example, if topology of a top layer visible in a contrast image is registered to a layout overlay so that a FIB operation box can be placed relative to a much lower layer. Thick power planes on top metal with large features relative to lower layer features exacerbate these registration errors. Thus, top layer features cannot always be trusted as fiducial marks for lower-level conductors.

Such registration errors can be compensated by characterizing the layer offsets prior to beginning debug of the IC, either per die or per wafer. Offset vectors for each die or wafer are then stored in a look-up table. The stored vectors can be retrieved and used to prepare a customized CAD layout displayed with differential layer offsets unique to the particular die or wafer. When registering a layout overlay to a contrast image of an IC, the stored vectors applicable to that IC are retrieved and employed to compensate the actual layer offsets between the layer providing topological information used for registration and the buried layer on which a FIB operation is to be performed.

Other Types of Overlay Images

While the foregoing description makes reference to overlay images generated from CAD data, such as layout images, other types of overlay images are useful in addition to or in place of layout images. For example, a feature which is not visible or is difficult to locate in a FIB contrast image may be visible in a SEM voltage-contrast image or in an optical image. A conductor lying below a dielectric layer can appear as a contrasting-voltage region in a SEM image. Since IC dielectric layers are transparent, a conductor lying below a dielectric layer may be visible in an optical image though not visible in a FIB contrast image. Surface topology visible in the FIB contrast image which is also visible in the SEM or optical images provides alignment points which can be used to register the FIB image with the SEM or optical image. Once the images are registered, the site of a selected feature of the sample can be determined, e.g., from data defining the SEM or optical image.

Figure 9:
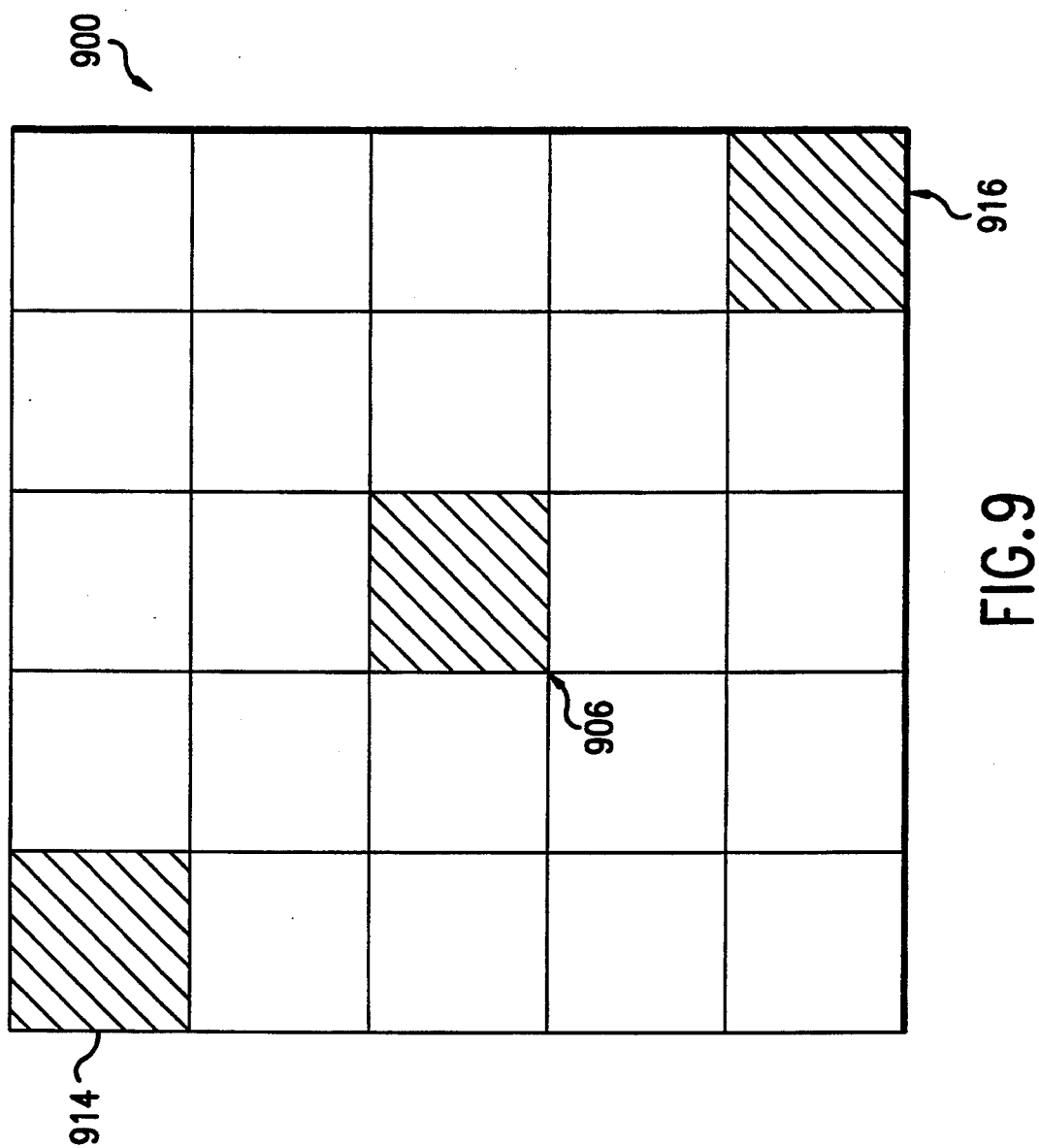
FIG. 9 illustrates tiling of images to produce a large-area overlay image in accordance with the invention.

The FOV of individual SEM or optical images may in some cases be too small for use as a large-area overlay image. If this occurs, multiple small-area images can be "tiled" together to produce a large-area overlay image. FIG. 9 shows a large-area overlay image 900 composed by tiling together small-area images. In this example, FIB operation area 506 corresponds to small-area optical image 906, alignment area 514 corresponds to small-area optical image 914, and alignment area 516 corresponds to small-area optical image 916. Of course, the tiled small-area images must be accurately aligned. The tiling can be performed using automatic tiling routines, though such routines are not required. It is preferred that the magnification of the small-area images be accurately known though, if not, the large-area overlay can be calibrated with the FIB images using two or more alignment points. When magnification of the small-area images is accurately known or calibrated, and the relative positions of the small-area images is accurately known, then only the small-area images covering alignment areas 514 and 516 and FIB operation region 506 are needed. The time required to acquire the overlay information is thus reduced to that needed to acquire small-area images 914, 916 and 906.

By "contrast image" is meant not only an image generated with the aid of a FIB, but any image in which features of a sample can be discerned and used for image registration. Such images include FIB images, SEM images, laser images, optical images, secondary-ion images and secondary-electron images exhibiting features as topological contrast or voltage contrast or the like.

While the foregoing description has been made with particular reference to use of a FIB for milling operations, also contemplated are other FIB operations such as chemically-assisted ion-beam etching (CAIBE) and chemically-assisted ion-beam deposition of insulative or conductive material, as well as operations employing other types of beams including electron-beams, atomic-beams, molecular-beams, or laser beams, with or without chemical enhancement. Combinations of beams may also be employed; for example, a FIB may be used to prepare an IC by exposing a conductor for probing with an electron beam. It is known that an electron-beam probe can be used to make a voltage measurement on a conductor at a location where the conductor is buried under a non-conductive layer; techniques of the present invention can be used to accurately position the electron-beam probe relative to the buried conductor. Known techniques for correcting unwanted electron-beam deflection caused by the IC's static-electric and/or magnetic fields are implemented in commercially-available prior-art electron-beam systems.

The foregoing description of preferred embodiments of the invention is intended as illustrative only, and not as a limitation of the invention as defined by the claims which follow. Those of skill in the art will recognize many modifications which may be made in the preferred embodiments within the spirit and scope of the claimed invention.

We claim:

1. A method of determining the site of a selected feature of a specimen, comprising the steps of:

a. fixing a beam source (402) relative to a surface of a specimen (416) so that a beam (410) from the source can be directed at the surface over a region (506) which includes an expected site of a selected feature (504) of the specimen;
b. scanning the beam over a first alignment area (514) of the surface to acquire a first contrast image in which a first feature (518) is visible and which excludes the expected site of the selected feature;
c. displaying the first contrast image;
d. generating from stored data describing features of the specimen a first overlay image which includes a representation of the first feature;
e. displaying the first overlay image;
f. registering the first overlay image with the first contrast image using as a first alignment point the representation of the first feature in the first overlay image and the first feature visible in the first contrast image; and
g. determining the site of the selected feature from the stored data using the first alignment point as a reference.

2. The method of claim 1, further comprising the steps prior to step g. of:
h. scanning the beam over a second alignment area (516) of the surface to acquire a second contrast image in which a second feature (520) is visible and which excludes the expected site of the selected feature;
i. displaying the second contrast image;
j. generating from said stored data a second overlay image which includes a representation of the second feature;
k. displaying the second overlay image;
l. registering the second overlay image with the second contrast image using as a second alignment point the representation of the second feature in the second overlay image and the second feature visible in the second contrast image; and
wherein step g. further comprises determining the site of the selected feature from the stored data using the second alignment point as a reference 3. The method of claim 2, further comprising the steps prior to step g. of:
m. scanning the beam over a third alignment area of the surface to acquire a third contrast image in which a third feature is visible and which excludes the expected site of the selected feature;
n. displaying the third contrast image;
o. generating from said stored data a third overlay image which includes a representation of the third feature;
p. displaying the third overlay image;
q. registering the third overlay image with the third contrast image using as a third alignment point the representation of the third feature in the third overlay image and the third feature visible in the third contrast image; and
wherein step g. further comprises determining tile site of the selected feature from the stored data using the third alignment point as a reference.

4. The method of claim 1, where step b. further comprises acquiring the first contrast image with a resolution sufficient for registering with a predetermined accuracy the first overlay image and the first contrast image.

5. The method of claim 4, further comprising the steps prior to step b. of acquiring a large-area contrast image which includes the first alignment area (514) and said region (506) at a low resolution, the low resolution being inadequate for registering a contrast image and a layout image with said predetermined accuracy.

6. The method of claim 1, further comprising the steps of:
h. acquiring and displaying a contrast image of said region (506); and
i. superposing on tile displayed contrast image of said region an overlay showing the site of the hidden feature of the device.

7. The method of claim 1, wherein the beam source comprises a FIB column responsive to deflection control signals for controllably scanning the beam over the surface, and wherein step b. further comprises generating deflection control signals for scanning the beam over the first alignment area.

8. The method of claim 7, wherein generating deflection control signals for scanning the beam over the first alignment area comprises generating deflection control signals for scanning the beam over the region, and summing the deflection signals for scanning the beam over the region with offset signals to thereby scan the beam over the first alignment area.

9. The method of claim 7, wherein scanning the beam over the first alignment area comprises maintaining unchanged operating conditions of the beam source.

10. The method of claim 1, wherein step c. further comprises acquiring the first contrast image with an X-Y aspect ratio of other than 1:1.

11. The method of claim 10, wherein step e. further comprises displaying the first overlay image with an X-Y aspect ratio equal to the X-Y aspect ratio of the acquired first contrast image.

12. The method of claim 1, wherein the sample comprises a multi-layered IC device having offsets between layers of the device, wherein said stored data comprises layout information for each layer of the IC device and offset information describing the offsets between the layers of the device, and wherein step g. further comprises determining the site of the selected feature from the layout information and from the offset information.

13. The method of claim 1, wherein the stored data describing features of the specimen comprises a CAD description of the specimen, and wherein the first overlay image comprises a CAD layout image.

14. The method of claim 1, wherein the stored data describing features of the specimen comprises an optical description of the specimen, and wherein the first overlay image comprises an optical image.

15. The method of claim 1, wherein the beam source further comprises an electron-beam column responsive to deflection control signals for controllably scanning an electron beam over the surface, and wherein step b. comprises generating deflection control signals for scanning the beam over the first alignment area.

16. A method of determining the site of a selected feature of a specimen, comprising the steps of:
a. fixing a beam source (402) relative to a surface of a specimen (416) so that a beam (410) from the source can be directed at the surface over a region (506) which includes an expected site of a selected feature (504) of the specimen;
b. scanning the beam over a first alignment area (514) of the surface to acquire a first contrast image having an X-Y aspect ratio of other than 1:1 and in which a first feature (518) is visible;
c. displaying the first contrast image;

d. generating from stored data describing features of the specimen a first overlay image which includes a representation of the first feature;
e. displaying the first overlay image;
f. registering the first overlay image with the first contrast image using as a first alignment point the representation of the first feature in the first overlay image and the first feature visible in the first contrast image; and
g. determining the site of the selected feature from the stored data using the first alignment point as a reference.

17. The method of claim 16, wherein step e. further comprises displaying the first overlay image with an X-Y aspect ratio equal to the X-Y aspect ratio of the acquired first contrast image.

18. The method of claim 16, wherein the beam source comprises a FIB column responsive to deflection control signals for controllably scanning the beam over the surface, and wherein step b. further comprises generating deflection control signals for scanning the beam over the first alignment area.

19. The method of claim 16, wherein the beam source comprises an electron-beam column responsive to deflection control signals for controllably scanning an electron beam over the surface, and wherein step b. further comprises generating deflection control signals for scanning the beam over the first alignment area.

20. The method of claim 16, wherein the stored data describing features of the specimen comprises a CAD description of the specimen, and wherein the first overlay image comprises a CAD layout image.

21. Apparatus for positioning a beam relative to a selected feature of a specimen, comprising:
a. a focused-particle beam column (402) responsive to deflection control signals for controllably scanning a beam (410) over a region of a surface of a specimen (416);
b. a source (438) of an X-deflection control signal;
c. a source (604) of an X-offset control signal;
d. a first junction (608) for combining the X-deflection control signal with the X-deflection offset signal to produce a resultant X-axis signal and for supplying the resultant X-axis signal to the focused-particle beam column;
e. a source (440) of a Y-deflection control signal;
f. a source (606) of a Y-offset control signal; and
g. a second junction (614) for combining the Y-deflection control signal with the Y-deflection offset signal to produce a resultant Y-axis signal and for supplying the resultant Y-axis signal to the focused-particle beam column.

* * * * *